(12) United States Patent
Artmann et al.

(10) Patent No.: US 12,265,132 B2
(45) Date of Patent: Apr. 1, 2025

(54) UPDATING BATTERY CAPACITY AFTER CLINICAL IMPLEMENTATION

(71) Applicant: Medtronic, Inc., Minneapolis, MN (US)

(72) Inventors: Joel B. Artmann, Elk River, MN (US); Brian Douglas Kuhnley, Delano, MN (US); Gang Ji, Medina, MN (US)

(73) Assignee: Medtronic, Inc., Minneapolis, MN (US)

( * ) Notice: Subject to any disclaimer, the term of this patent is extended or adjusted under 35 U.S.C. 154(b) by 658 days.

(21) Appl. No.: 17/547,611

(22) Filed: Dec. 10, 2021

(65) Prior Publication Data

US 2022/0196747 A1     Jun. 23, 2022

Related U.S. Application Data

(60) Provisional application No. 63/130,349, filed on Dec. 23, 2020.

(51) Int. Cl.
*H01M 10/44* (2006.01)
*G01R 31/382* (2019.01)
(Continued)

(52) U.S. Cl.
CPC ......... *G01R 31/382* (2019.01); *G01R 31/392* (2019.01); *H01M 10/441* (2013.01); *H01M 2010/4271* (2013.01)

(58) Field of Classification Search
CPC ................. H02J 7/0048; G01R 31/392; G01R 31/382; G01R 31/387; H01M 10/441; H01M 2010/4271
(Continued)

(56) References Cited

U.S. PATENT DOCUMENTS

| 4,433,294 A | 2/1984 | Windebank |
| 8,450,978 B2 | 5/2013 | Barsukov et al. |

(Continued)

FOREIGN PATENT DOCUMENTS

| EP | 2162752 | 3/2010 |
| EP | 2793038 | 10/2014 |

(Continued)

OTHER PUBLICATIONS

Albanas et al., "Analysis of CT-CV Charging Technique for Lithium-ion and NCM 18650 Cells Over Temperature Range", 2020 IEEE International Conference on Industrial Technology (ICIT), Feb. 26, 2020, pp. 947-952.

(Continued)

*Primary Examiner* — Edward Tso
(74) *Attorney, Agent, or Firm* — Mueting Raasch Group

(57) ABSTRACT

A method for battery management, the method including determining an amount of charge $Q_{chg}$ delivered to the battery during a portion of a charging cycle. The method can also include measuring state of charge ($SoC_{full}$) of the battery subsequent to the charging cycle, and determining an amount of charge $Q_{dsg}$ produced by the battery during a discharging cycle of the battery to a depth of discharge (DoD) threshold. The method can also include measuring state of charge ($SoC_{empty}$) of the battery subsequent to discharging the battery. The method can include determining total battery capacity based on the values determined in previous operations. Apparatuses and systems for battery management are also described.

38 Claims, 6 Drawing Sheets

(51) Int. Cl.
*G01R 31/392* (2019.01)
*H01M 10/46* (2006.01)
*H01M 10/42* (2006.01)

(58) Field of Classification Search
USPC ........ 320/107, 132, 134, 136, 149; 324/426, 324/427, 433, 434
See application file for complete search history.

(56) References Cited

U.S. PATENT DOCUMENTS

| | | |
|---|---|---|
| 9,146,280 B2 | 9/2015 | Sun et al. |
| 9,651,628 B2 | 5/2017 | Mattisson et al. |
| 2002/0140400 A1 | 10/2002 | Hatori et al. |
| 2004/0220758 A1 | 11/2004 | Barsoukov et al. |
| 2004/0232881 A1 | 11/2004 | Amano et al. |
| 2010/0194341 A1 | 8/2010 | Anupindi et al. |
| 2011/0130985 A1 | 6/2011 | Plett |
| 2012/0217934 A1 | 8/2012 | Zhou et al. |
| 2015/0066262 A1 | 3/2015 | Chang |
| 2015/0226807 A1 | 8/2015 | Aumentado et al. |
| 2015/0349385 A1 | 12/2015 | Hu et al. |
| 2016/0011273 A1 | 1/2016 | Mattisson |
| 2017/0227607 A1* | 8/2017 | Wu .............. H01M 6/5083 |
| 2017/0227609 A1* | 8/2017 | Wu .............. H01M 10/48 |
| 2019/0033378 A1 | 1/2019 | Kondo |
| 2020/0067335 A1 | 2/2020 | Lim et al. |
| 2021/0325464 A1 | 10/2021 | Kondo |
| 2022/0156747 A1* | 5/2022 | Kumawat ........ G06Q 20/35765 |

FOREIGN PATENT DOCUMENTS

| | | |
|---|---|---|
| EP | 3640072 | 4/2020 |
| JP | 2008072883 | 3/2008 |

OTHER PUBLICATIONS

International Search Report and Written Opinion from PCT/US2021/062188 dated May 10, 2022, 12 pages.
International Search Report and Written Opinion from PCT Application No. PCT/US2021/063214 dated Mar. 25, 2022, 13 pages.

* cited by examiner

UPDATING BATTERY CAPACITY AFTER CLINICAL IMPLEMENTATION

RELATED APPLICATIONS

This application claims the benefit under 35 U.S.C. § 119 of U.S. Provisional Application No. 63/130,349, filed Dec. 23, 2020, which is incorporated herein by reference in its entirety.

FIELD

The present technology is generally related to techniques for battery management. More specifically, the present technology relates to techniques for accurately determining the true charge state and total capacity of a battery after using the battery in a clinical environment.

BACKGROUND

Rechargeable batteries provide power in a wide variety of systems, including medical device systems in which safety is of utmost importance. The full charge capacity of a battery is a measurement of the maximum chemical capacity of a rechargeable battery. As battery cells age, the full charge capacity of the battery generally decreases, and the true charge state of the battery can be difficult to determine with great accuracy. Because measuring and updating the full charge capacity and state of charge is fundamental to safe operation of medical devices, there is a general need to more accurately perform these tasks for batteries providing power to medical devices. Measurement becomes even more complicated and error-prone after the battery has been used in a clinical environment.

SUMMARY

The techniques of this disclosure generally relate to methods, systems, and apparatuses for determining total capacity of a battery.

In one aspect, the present disclosure provides a method including determining an amount of charge delivered to a battery during a portion of a charging cycle. The method can further include measuring state of charge of the battery subsequent to the charging cycle. The battery may, in embodiments, be fully charged. Upon determining state of charge when the battery is full, the method can determine an amount of charge produced by the battery during a discharging cycle of the battery to a depth of discharge (DoD) threshold. After the discharging cycle, the state of charge is determined while the battery is empty. Total capacity can then be calculated based on state of charge while the battery is empty, state of charge while the battery is full, and amount of charge produced during at least one of a discharge cycle and a charge cycle.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

Battery capacity corresponds to the quantity of electric charge that can be accumulated during battery charging, stored in open circuit conditions, and released during battery discharge. When the battery is discharged with constant current, battery capacity is given by the formula $C_d = I \cdot t_d$, where $t_d$ is the discharge duration and I is current. When discharge duration is expressed in hours, the typical unit for battery capacity is the Ampere-hour (AH).

State of charge (SoC) of a battery indicates voltage at the terminals of that battery when the battery is at rest, or in equilibrium. The mathematical relationship between SoC and equilibrium voltage is a known relationship and is based on battery type. Equilibrium voltage and SoC can be used to determine total capacity and remaining capacity of the battery.

However, as the battery ages, the total capacity of the battery fades. Without adequately tracking the total capacity of battery, the estimate of the SoC and remaining capacity of the battery will become less accurate. Furthermore, after the battery has been used in a clinical setting, it may have varying total remaining capacity due to battery age or other factors. These and other issues can lead to safety implications in a clinical environment where it is important to know total remaining capacity of batteries that may be powering medical devices.

To remedy these and other problems, embodiments provide methods for more accurately determining battery capacity. Some embodiments provide methods for determining battery capacity subsequent to usage of the battery in a clinical setting, for example, usage within a medical device, although embodiments are not limited thereto.

Figure 1:
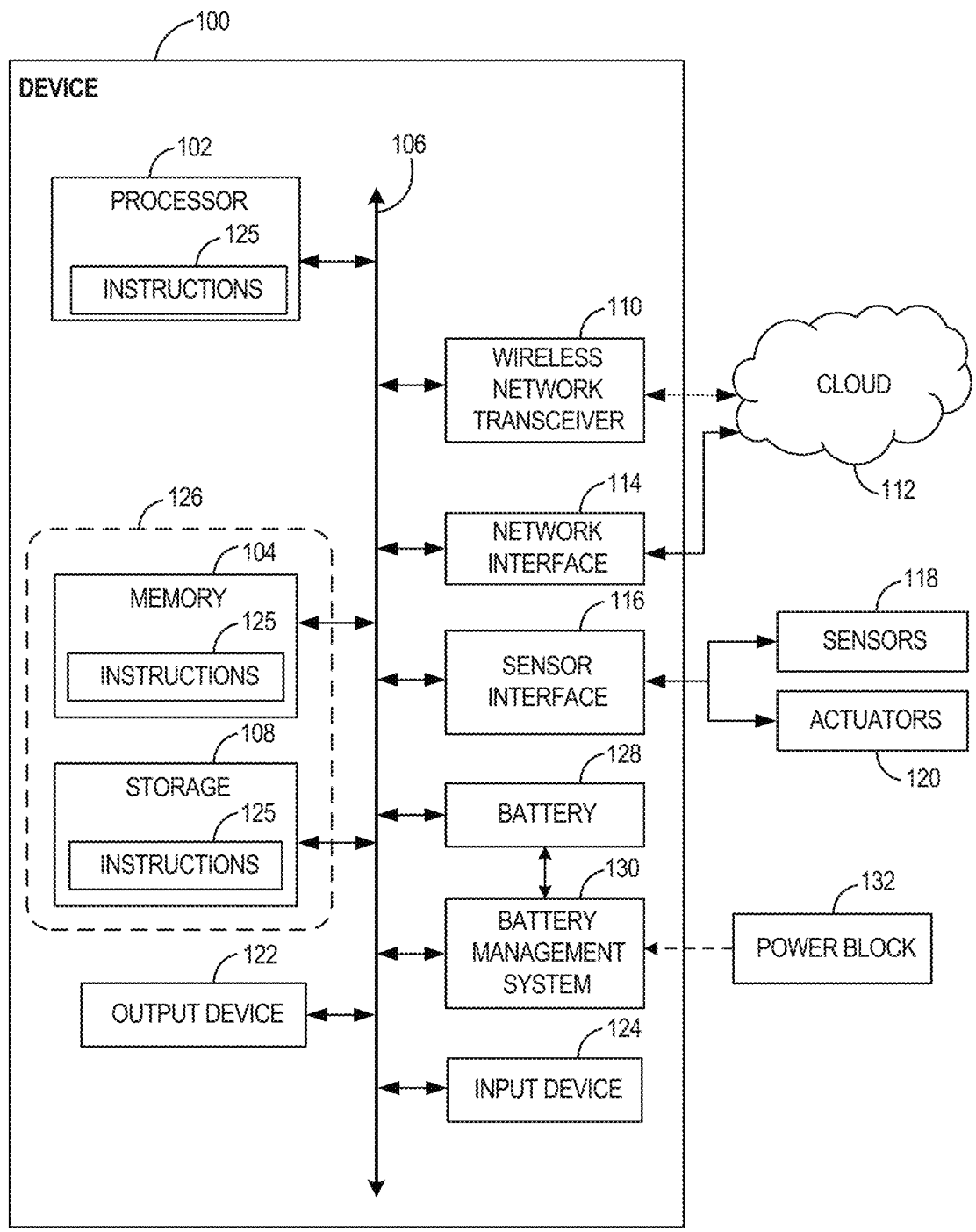
FIG. 1 is a block diagram of a device that includes a battery management system for managing a battery in accordance with some embodiments.

FIG. 1 is a block diagram of a device 100 that includes a battery management system for managing a battery according to operations, processes, methods, and methodologies of embodiments. This device 100 may include any combinations of the hardware or logical components referenced herein. The device 100 can include components of, or be used to control operations of, a ventricular assist device. The device 100 may include or couple with any other device, for example other devices needed for implementation of patient therapies.

The device 100 may include processing circuitry in the form of a processor 102, which may be a microprocessor, a multi-core processor, a multithreaded processor, an ultra-low voltage processor, an embedded processor, or other known processing elements. The processor 102 may be a part of a system on a chip in which the processor 102 and other components described herein are formed into a single integrated circuit.

A battery 128 may power the device 100, although, in examples in which the device 100 is in a fixed location, the device 100 may have a power supply coupled to an electrical grid. The battery 128 may include one or more electrochemical cells and may be a lithium ion battery although embodiments are not limited thereto. A battery management system 130 may be included in the device 100 or the battery management system 130 may be part of an external device coupled to the device 100 to track the state of charge (SoC) of the battery 128. An external power source 132, or other power supply coupled to a grid, may be coupled with the battery management system 130 yet separate from the battery, to charge the battery 128. In other words, the external power source 132 can act as a charger in some embodiments. In some examples, the external power source 132 may be replaced with a wireless power receiver to obtain the power wirelessly. Further detail regarding the battery management system 130 is provided below with reference to FIG. 2.

Figure 2:
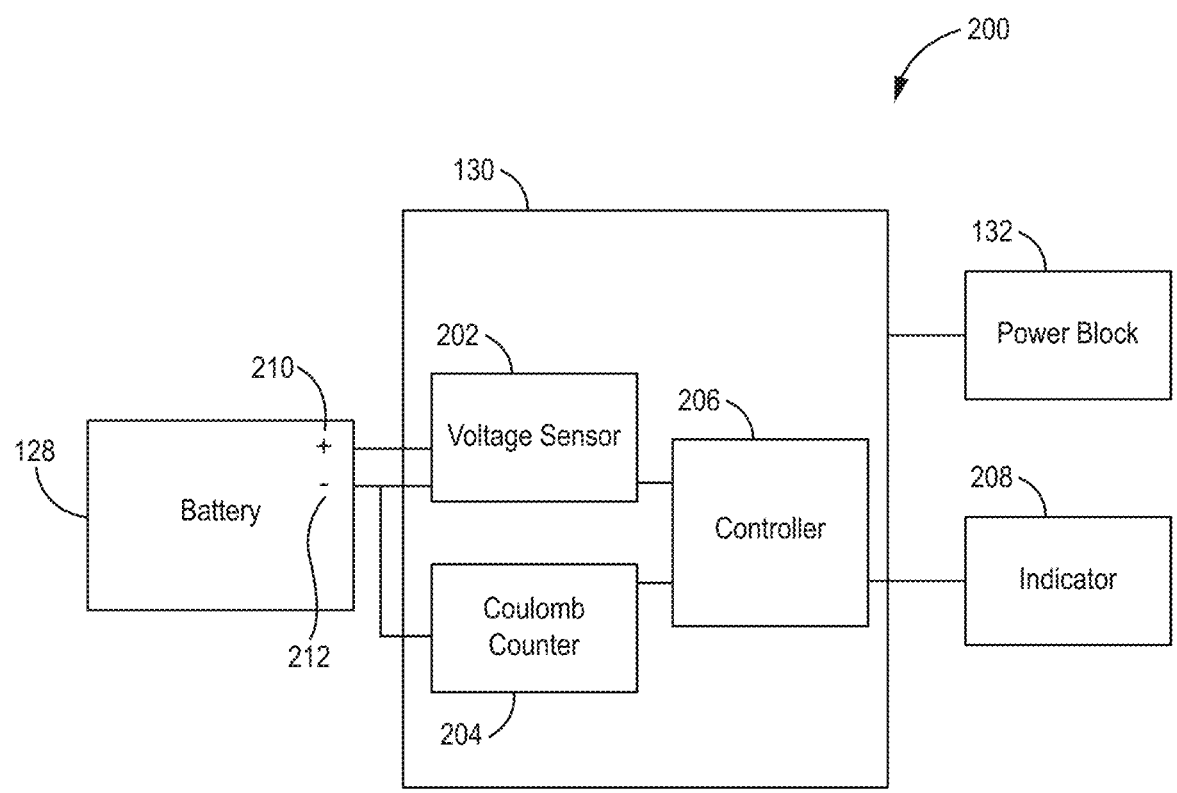
FIG. 2 is a block diagram of a device that illustrates further detail of a battery management system in accordance with some embodiments.

FIG. 2 is a block diagram of a system 200. Further detail is provided of the battery management system 130 in accordance with some embodiments. The battery management system 130 may be used to monitor other parameters of the battery 128 to provide failure predictions, such as the state of health (SoH) and the state of function (SoF) of the battery 128. The battery management system 130 may include battery monitoring circuitry, for example a voltage sensor 202 and a coulomb counter 204. The coulomb counter 204 can comprise a resistive element placed in series with one of the battery 128 terminals 210, 212. The coulomb counter 204 acts like an integrator, so that the voltage across the coulomb counter 204 resistive element is measured over time and therefore represents a quantity that is proportional to a time integral of the current flowing through the resistive element. Such a time-integrated current is the cumulative electrical charge that has flowed through the coulomb counter 204. The cumulative electrical charge detected by the coulomb counter 204 can be compared with capacity of the fully-charged battery 128 to provide an indicator of charge remaining, or other battery health or status indicator as described later herein. The coulomb counter 204 can provide an indication of cumulative electrical charge detected to other components of the battery management system 130.

The battery management system 130 may include control circuitry 206. In embodiments control circuitry 206 is executed on the processor 102 (FIG. 1) of the device 100, although embodiments are not limited thereto. For example, in some embodiments, the battery management system 130 can include processing circuitry for execution of at least some operations included in control circuitry 206.

The control circuitry 206 can control a charging cycle of the battery 128 according to methods described later herein. The control circuitry 206 can also control a discharge cycle of the battery 128 based on inputs (e.g., indications of cumulative electrical charge) from the coulomb counter 204. In some embodiments, charging cycles can occur while the external power source 132 is providing power (e.g., is connected) to the battery management system 130, and discharging can occur while the external power source 132 is disconnected from the battery management system, although embodiments are not limited thereto. An indicator (e.g., a fuel gauge) 208 measures the amount of charge remaining in the battery 128 and provides indicators thereof to the control circuitry 206. In some examples, the indicator 208 can include a capacity indicator. In some examples, the indicator 208 can provide a service indication responsive to the battery 128 total capacity falling or deteriorating below a threshold, which can indicate age, damage, or other wellness conditions of the battery 128.

Battery 128 capacity corresponds to the quantity of electric charge that can be accumulated during battery 128 charging, stored in open circuit conditions, and released during battery 128 discharge. When the battery 128 is discharged with constant current (e.g., during a discharge cycle according to methods described herein, or during normal operations of the device 100), battery 128 capacity is given by the formula $C_d = I \cdot t_d$, where $t_d$ is the discharge duration and I is current. When discharge duration is expressed in hours, the typical unit for battery 128 capacity is the Ampere-hour (AH).

SoC of the battery 128 indicates voltage at the terminals 210, 212 of that battery 128 when the battery 128 is at rest, or in equilibrium. The mathematical relationship between SoC and equilibrium voltage is a known relationship and is based on battery type. When the battery 128 is not in equilibrium, current is flowing through the battery 128. In this situation, the actual voltage at the terminals 210, 212 of the battery 128 is lower than the equilibrium voltage by an amount that can be calculated using Ohm's Law knowing internal resistance of the battery 128 and knowing the current flowing between the terminals. Available battery 128 capacity can be calculated using this estimate of equilibrium voltage. However, methods for estimating equilibrium voltage are subject to errors, especially as the age of the battery 128 increases. Furthermore, as the battery 128 ages, the total capacity of the battery 128 fades. Without adequately tracking the total capacity of the battery 128, the estimate of the SoC and remaining capacity of the battery 128 will become less accurate.

To remedy these and other problems, the control circuitry 206 provides a controlled charging cycle to achieve a successful capacity update. Successful capacity updates can depend on stability of open circuit voltage (OCV), temperature, depth of discharge (DoD) and other conditions. All these conditions, and other conditions, can be controlled by charge and discharge cycles that are controlled in accordance with embodiments. In some embodiments, the battery 128 is charged and recharged, and the control circuitry 206 and related circuitry determine the amount of charge at each point to derive a value for total battery capacity.

Figure 3:
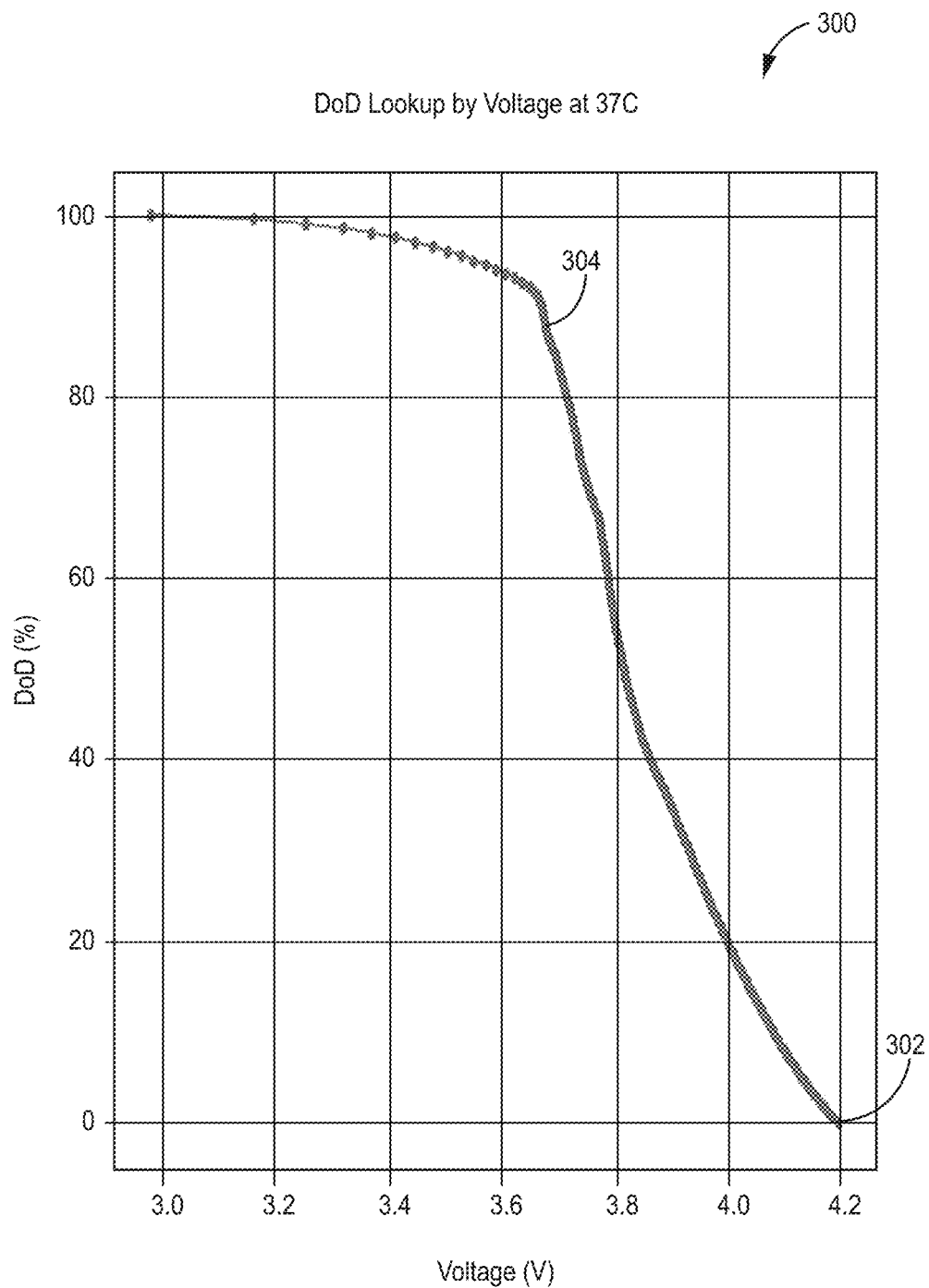
FIG. 3 illustrates a function for finding depth of discharge (DoD) of a battery based on open circuit voltage (OCV) in accordance with embodiments.

FIG. 3 illustrates a function 300 for finding DoD of a battery 128 based on OCV in accordance with embodiments. Function 300 can be derived by, for example, testing typical batteries used in medical devices, at body temperature 37 Celsius. Sensors and apparatuses described earlier herein (e.g., voltage sensor 202 (FIG. 2)) can measure OCV of the battery 128 at various points in time (e.g., when the battery 128 is in a relaxed state) according to control provided by control circuitry 206 (FIG. 2), as will be described later herein with respect to FIG. 6. Control circuitry 206 can then estimate DoD using the function 300 and determine battery 128 state-of-charge (SoC) according to SoC=1−DoD.

In some examples, the control circuitry 206 will discharge the battery until an OCV of about 3.7 volts is detected. This is because, as can be appreciated upon inspection of the function 300, DoD voltage change is steep from a fully charged state 302 until about 3.7 volts (point 304). Further discharging from point 304 results in smaller changes in DoD, and therefore OCV measurement errors will have less impact on DoD accuracy and SoC can be determined with greater accuracy. Additionally, discharging further than point 304 can result in dangerous conditions for the patient if external power is lost and the device 100 switches to battery 128 power due to the insufficient energy left in the battery. Finally, by determining OCV at the highest or nearly-highest possible DoD (e.g., about 94% as seen in FIG. 3) and at the lowest or nearly-lowest possible DoD (e.g., a fully-charged battery 128), the total charge difference seen between point 302 and 304 is maximized and total capacity is more accurately determined.

Figure 4:
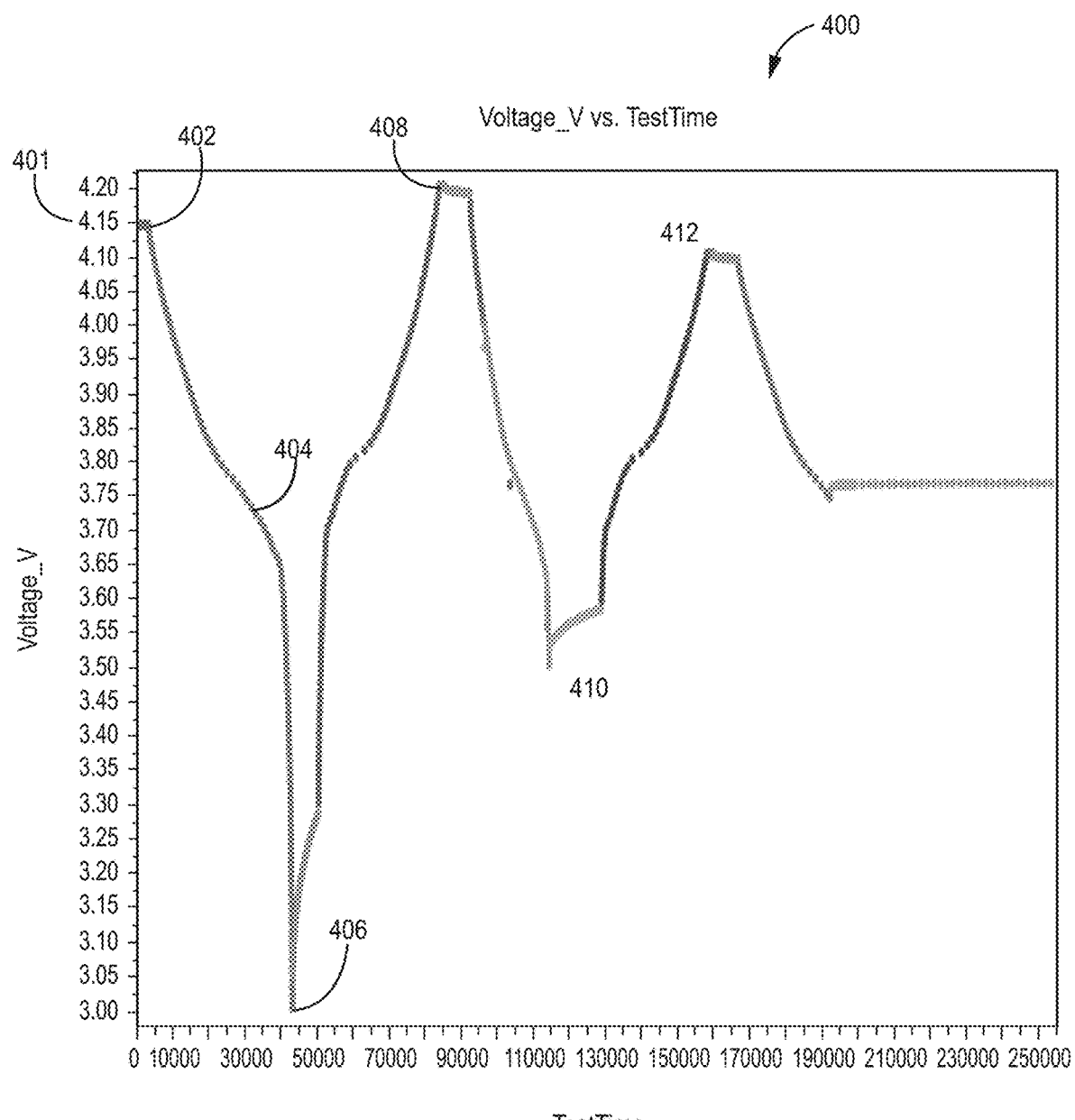
FIG. 4 is a graph that illustrates battery charge and discharge cycles in accordance with some embodiments.

FIG. 4 is a graph 400 that illustrates battery charge and discharge cycles in accordance with some embodiments. The graph 400 illustrates OCV 401 at various points throughout battery 128 charge and discharge cycles including relaxation periods as described below. The SOC of battery 128 at different stages, for example at the end of charge or discharge, can be determined by the transfer functions 300 shown in FIG. 3. For example, given a measured OCV 401, the control circuitry 206 (FIG. 2) can determine DoD by inspection of the transfer function 300. The control circuitry 206 can then determine SoC of the battery 128 by calculating SoC according to SoC=1−DoD.

At point 402, the battery 128 is fully charged, and voltage is stable. The control circuitry 206 and associated circuitry can measure DoD at point to derive SoC at the fully charged state ($SoC_{full}$). The control circuitry 206 can control the battery 128 to discharge to point 404, at which point OCV may drop steeply, or continue to further discharge to point 406. In some embodiments, discharge can occur until the device 100 transmits a low-charge alarm, although embodiments are not limited thereto. Coulomb counter 204 can determine the cumulative charge that flows through the coulomb counter 204 during the discharge cycle from point 402 to 404 (or to 406), which in turn can be used to determine charge capacity $Q_{dsg}$ of the battery 128. At point 404 (or 406), a patient or clinician may connect the external power source 132 to power the device 100, and the battery 128 may rest for an amount of time (in some examples, for about three hours) or until an indicator such as a ready signal is provided by the battery 128 or device 100, at which point SoC is measured to give $SoC_{empty}$.

The battery 128 can be charged to point 408 and the coulomb counter 204 can determine the cumulative charge $Q_{chg}$ produced by a battery during a portion of a charging cycle (e.g., from point 404 (or 406) to point 408). The battery 128 may rest for an amount of time and $SoC_{full}$ can again be measured. The battery 128 can again be discharged from point 408 to point 410. The battery 128 can be charged again to point 412, the coulomb counter 204 can similarly determine cumulative charge, and $SoC_{full}$ can be similarly measured a second time as described earlier above. By measuring and determine total charge and SoC multiple times, a more accurate result can be achieved through averaging, which removes artifacts and abnormalities in measurement. Furthermore, discharging to a certain point and then recharging can lead to a more accurate result. For example, discharging the battery to a threshold of about 90% DoD can result in measurement of a greater percentage of the total possible charge, because most DoD change occurs up until 90% DoD, with the most significant voltage drop.

Figure 5:
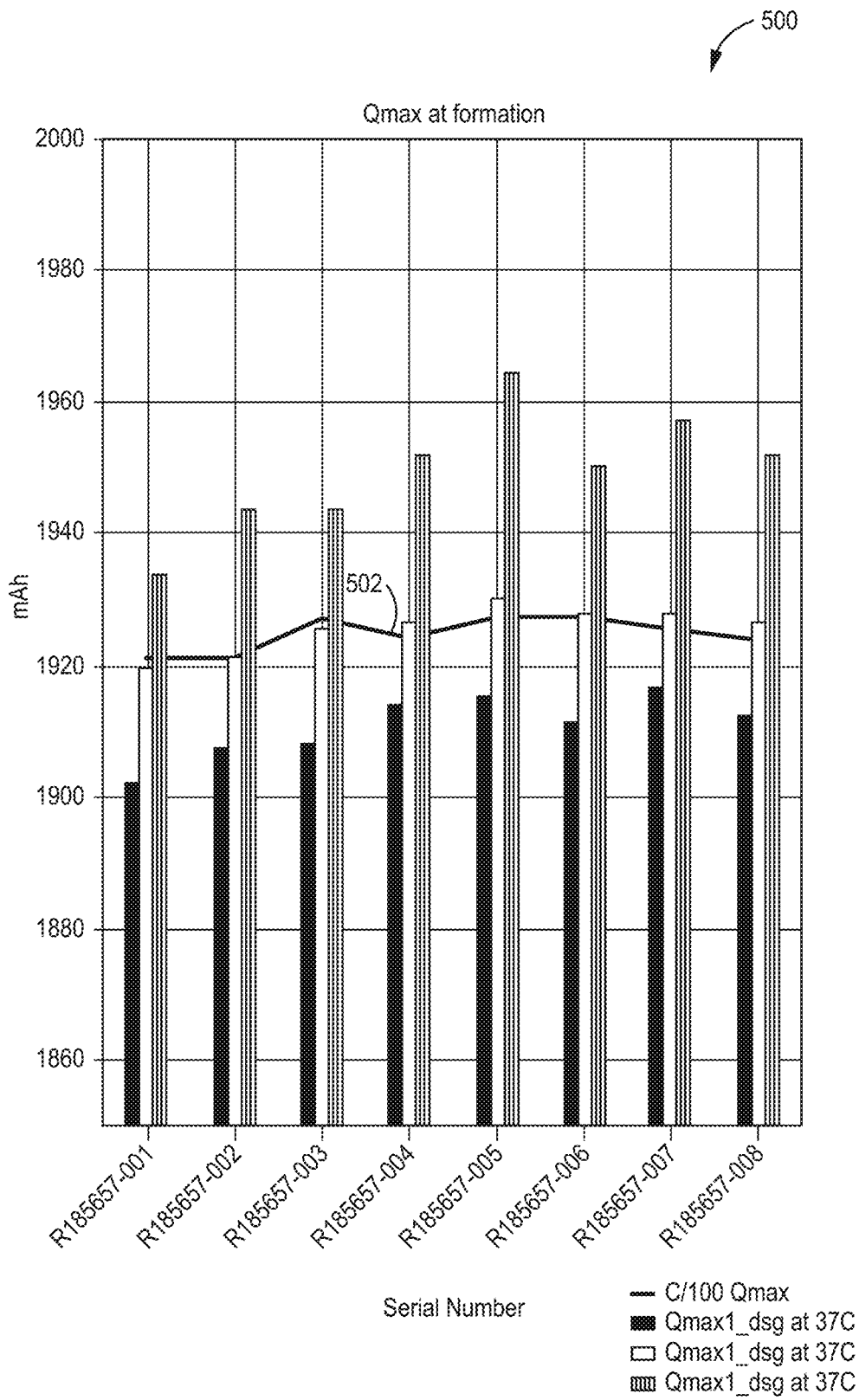
FIG. 5 is a graph that illustrates total capacity of different batteries as calculated in accordance with some embodiments.

FIG. 5 is a graph 500 that illustrates total capacity of different batteries as calculated in accordance with some embodiments. For the battery serial numbers shown along the x-axis, three different total capacity ($Q_{max}$) values are shown in units of milliamps hour (mAh). Total capacity can be calculated based on the cumulative charge ($Q_{chg}$ or $Q_{dsg}$) and SoC differences determined during discharge and charge cycles as described above. The chemical capacity $Q_{max}$ measured under a very small current is represented at line 502, which can represent an accurate capacity measurement value.

Figure 6:
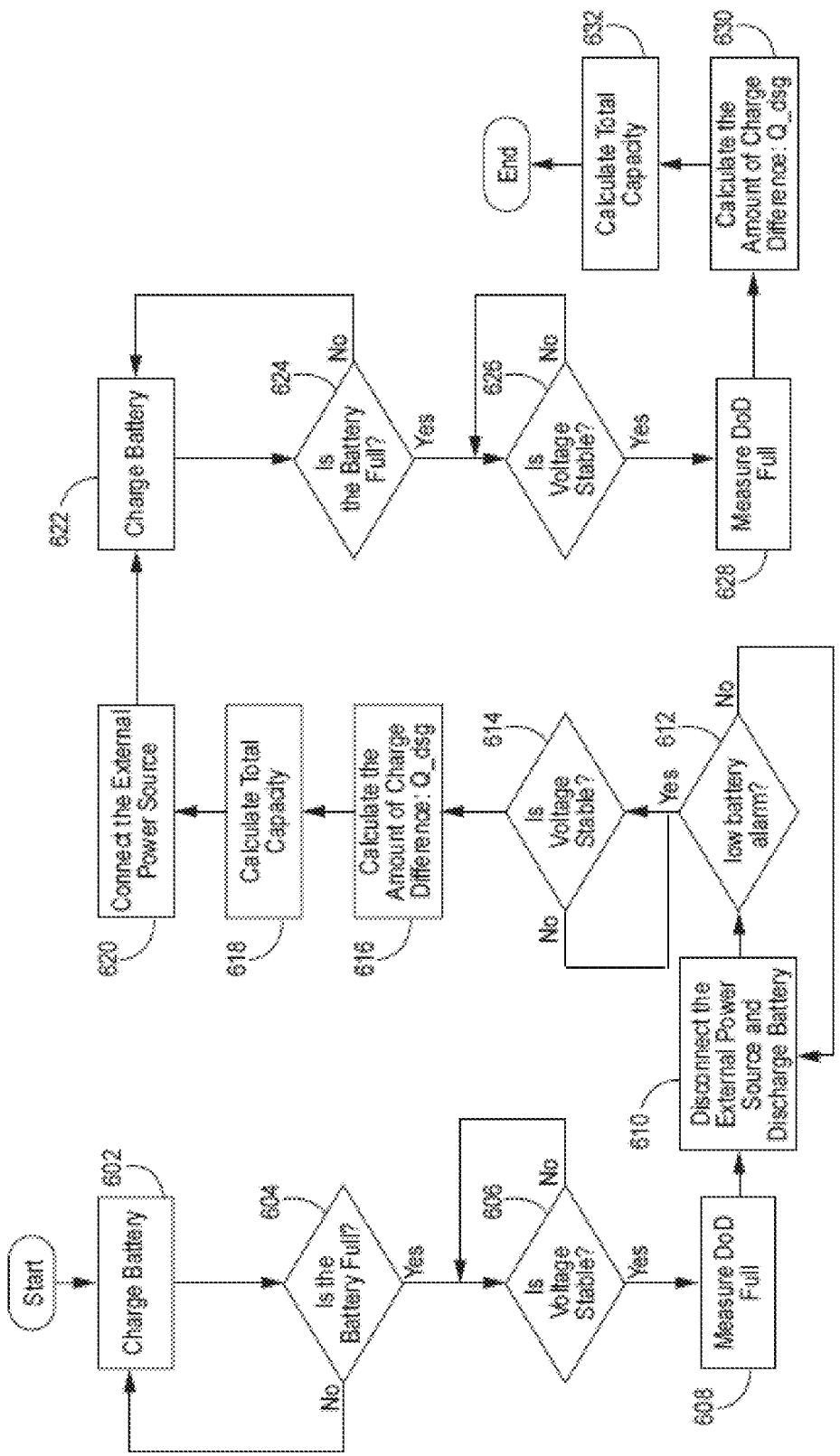
FIG. 6 is a flow diagram of a method that illustrates control logic for battery management in accordance with embodiments.

FIG. 6 illustrates a method 600 for determining battery 128 capacity. Some operations of method 600 are performed by components illustrated in FIG. 1 and FIG. 2, for example, control circuitry 206, coulomb counter 204, etc.

Method 600 begins with operation 602 by the control circuitry 206 (FIG. 2) controlling a charging process of the battery 128 to a fully-charged state as determined at operation 604. The control circuitry 206 then controls the battery 128 to remain in a rest state, for example for about three hours, or until voltage is stable at operation 606. Throughout operations 602, 604, and 606, the device 100 may remain connected to external power source 132 while battery 128 remains in a rest state for an amount of time (for example, around two hours) or until a ready signal is provided (by battery/fuel gauge). At such a time as the rest state is completed (or the ready signal is provided), the coulomb counter 204 will determine charge in order to measure SoC, based on DoD in operation 608, and this value will be used in future calculations as the fully-charged value (e.g., $SoC_{full}$).

Method 600 may continue with operation 610 with the external power source 132 being disconnected and with the battery 128 providing power to the device 100, in place of the external power source 132. The battery 128 may provide power to the device 100 for a time duration or responsive to the device 100 transmitting a low-charge alarm at operation 612. The device 100 is then connected to external power source 132 so that the battery 128 can rest. Once the battery 128 voltage is stable at operation 614, the coulomb counter 204 can determine $Q_{dsg}$ at operation 616 as described earlier here. The control circuitry 206 can then calculate total capacity $Q_{max}$ in operation 618 according to:

$$Q_{max}=Q_{dsg}/(SoC_{full}-SOC_{empty}) \quad (1)$$

Method 600 continues with operation 620 with connecting the device 100 to the external power source 132 (i.e., removing the device 100 from battery 128 power). The control circuitry 206 will proceed with controlling a charging process 622 of the battery 128 to a fully-charged state as determined at operation 624. The control circuitry 206 then controls the battery 128 to remain in a rest state, for example for about three hours, or until voltage is stable at operation 626. Throughout operations 622, 624, and 626, the device 100 may remain connected to external power source 132 while battery 128 remains in a rest state for an amount of time (for example, around two hours) or until a ready signal is provided (by battery/fuel gauge). At such a time as the rest state is completed (or the ready signal is provided), the coulomb counter 204 will determine charge $Q_{chg}$ in operation 630 and DoD (from which $SoC_{full}$ can be derived) in operation 628.

The values determined in the above operations 620-630 can be used to calculate total capacity of the battery 128 according to Equation (2):

$$Q_{max}=Q_{chg}/(SoC_{full}-SOC_{empty}) \quad (2)$$

Referring again to FIG. 1, other components that can be included in the device 100 are described. The processor 102 may communicate with a system memory 104 over an interconnect 106 (e.g., a bus). Any number of memory devices may be used to provide for a given amount of system memory. As examples, the memory 104 may be random access memory (RAM). However, any other type of memory can be included. Persistent storage can also be provided by storage 108. Storage 108 may also couple to the processor 102 via the interconnect 106. Storage 108 may include disk drives, flash memory cards, Universal Serial Bus (USB) flash drives, etc.

The components may communicate over the interconnect 106. The interconnect 106 may include any number of technologies, including industry standard architecture (ISA), extended ISA (EISA), peripheral component interconnect (PCI), peripheral component interconnect extended (PCIx), PCI express (PCIe), or any number of other technologies. The interconnect 106 may be a proprietary bus.

The interconnect 106 may couple the processor 102 to a transceiver 110. The transceiver 110 may use any number of frequencies and protocols, IEEE, or Bluetooth protocols, although embodiments are not limited to these protocols. The transceiver 110 may be included to communicate with devices or services in the cloud 112 via local or wide area network protocols.

A network interface controller (NIC) 114 may be included to provide a wired communication to other devices or systems through the cloud 112. The wired communication may provide an Ethernet connection or may be based on other types of networks. The interconnect 106 may couple the processor 102 to a sensor interface 116 that is used to connect additional devices or subsystems. These additional devices may include sensors 118, such as optical light sensors, camera sensors, temperature sensors, and the like. The interface 116 further may be used to connect the device 100 to actuators 120, such as power switches, valve actuators, an audible sound generator, a visual warning device, and the like.

In some optional examples, various input/output (I/O) devices may be present within or connected to, the device 100. For example, a display or other output device 122 may be included to show information, such as sensor readings, fuel gauge readings, fuel gauge diagnostic outputs, etc. An input device 124, such as a button, touch screen or keypad may be included to accept input. An output device 122 may include any number of forms of audio or visual display, including simple visual outputs such as binary status indicators (e.g., light-emitting diodes (LEDs)) and multi-character visual outputs, or more complex outputs such as display screens (e.g., liquid crystal display (LCD) screens), with the output of characters, graphics, multimedia objects, and the like being generated or produced from the operation of the device 100. A display or console hardware, in the context of the present system, may be used to provide output and receive input of a medical device, including an implantable medical device; to identify a state of a medical device or related/connected devices; or to conduct any other number of management or administration functions.

The storage 108 may include instructions 125 in the form of software, firmware, or hardware commands to implement the techniques described herein. Although such instructions 125 are shown as code blocks included in the memory 104 and the storage 108, it may be understood that any of the code blocks may be replaced with hardwired circuits, for example, built into an application specific integrated circuit (ASIC).

In an example, the instructions 125 provided via the memory 104, the storage 108, or the processor 102 may be embodied as a non-transitory, machine-readable medium 126 including code to direct the processor 102 to perform electronic operations in the device 100. The processor 102 may access the non-transitory, machine-readable medium 126 over the interconnect 106. For instance, the non-transitory, machine-readable medium 126 may be embodied by devices described for the storage 108 or may include specific storage units such as optical disks, flash drives, or any number of other hardware devices. The non-transitory, machine-readable medium 126 may include instructions to direct the processor 102 to perform a specific sequence or flow of actions, for example, as described with respect to the flowchart(s) and block diagram(s) of operations and functionality depicted above. As used herein, the terms "machine-readable medium" and "computer-readable medium" are interchangeable.

In further examples, a machine-readable medium also includes any tangible medium that is capable of storing, encoding or carrying instructions for execution by a machine and that cause the machine to perform any one or more of the methodologies of the present disclosure or that is capable of storing, encoding or carrying data structures utilized by or associated with such instructions. A "machine-readable medium" thus may include but is not limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks. The instructions embodied by a machine-readable medium may further be transmitted or received over a communications network using a transmission medium via a network interface device utilizing any one of a number of transfer protocols (e.g., Hypertext Transfer Protocol (HTTP)).

A machine-readable medium may be provided by a storage device or other apparatus which is capable of hosting data in a non-transitory format. In an example, information stored or otherwise provided on a machine-readable medium may be representative of instructions, such as instructions themselves or a format from which the instructions may be derived. This format from which the instructions may be derived may include source code, encoded instructions (e.g., in compressed or encrypted form), packaged instructions (e.g., split into multiple packages), or the like. The information representative of the instructions in the machine-readable medium may be processed by processing circuitry into the instructions to implement any of the operations discussed herein. For example, deriving the instructions from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions.

Various aspects disclosed herein may be combined in different combinations than the combinations specifically presented in the description and accompanying drawings. It should also be understood that, depending on the example, certain acts or events of any of the processes or methods described herein may be performed in a different sequence, may be added, merged, or left out altogether (e.g., all described acts or events may not be necessary to carry out the techniques). In addition, while certain aspects of this disclosure are described as being performed by a single module or unit for purposes of clarity, it should be understood that the techniques of this disclosure may be performed by a combination of units or modules associated with, for example, a medical device.

In one or more examples, the described techniques may be implemented in hardware, software, firmware, or any combination thereof. If implemented in software, the functions may be stored as one or more instructions or code on a computer-readable medium and executed by a hardware-based processing unit. Computer-readable media may include non-transitory computer-readable media, which corresponds to a tangible medium such as data storage media (e.g., RAM, ROM, EEPROM, flash memory, or any other medium that can be used to store desired program code in the form of instructions or data structures and that can be accessed by a computer).

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor" as used herein may refer to any of the foregoing structure or any other physical structure suitable for implementation of the described techniques. Also, the techniques could be fully implemented in one or more circuits or logic elements.

What is claimed is:

1. A method comprising:
   determining an amount of charge $Q_{chg}$ delivered to a battery during a portion of a charging cycle;
   measuring state of charge ($SoC_{full}$) of the battery subsequent to the charging cycle, determining an amount of charge $Q_{dsg}$ produced by the battery during a discharging cycle of the battery to a depth of discharge (DoD) threshold;
   measuring state of charge ($SoC_{empty}$) of the battery subsequent to discharging the battery;
   determining total capacity $Q_{max}$ based on $SoC_{full}$, $SoC_{empty}$, and at least one of $Q_{chg}$ and $Q_{dsg}$; and
   providing a relaxation period subsequent to at least one of the charging cycle and the discharging cycle, and prior to at least one of measuring $SoC_{full}$ and $SoC_{empty}$.

2. The method of claim 1, wherein the DoD threshold is determined based on battery age.

3. The method of claim 2, wherein the DoD threshold is about 90%.

4. The method of claim 2, further comprising:
   terminating the discharging cycle responsive to transmission of a low battery signal.

5. The method of claim 1, further comprising:
   providing an external power source, separate from the battery, during the discharging cycle.

6. The method of claim 1, further comprising:
   terminating the relaxation period responsive to receiving a signal indicating readiness of the battery.

7. The method of claim 1, further comprising:
   determining a first estimate of total capacity $Q_{max}$ based on $Q_{chg}$;
   determining a second estimate of total capacity $Q_{max}$ based on $Q_{dsg}$;
   determining an average value of the first estimate and the second estimate; and updating a capacity indicator based on the average value.

8. The method of claim 7, further comprising:
   storing estimates of $Q_{max}$; and
   providing a service indication responsive to $Q_{max}$ deteriorating below a threshold.

9. An apparatus comprising:
   a charger to charge one or more batteries; and
   control circuitry operably coupled to the charger and configured to:
      determine an amount of charge $Q_{chg}$ delivered to a battery coupled to the charger during a portion of a charging cycle;
      measure state of charge ($SoC_{full}$) of the battery subsequent to charging the battery, determine an amount of charge $Q_{dsg}$ produced by the battery during a discharging cycle of the battery to a depth of discharge (DoD) threshold;
      measure state of charge ($SoC_{empty}$) of the battery subsequent to discharging the battery; and
      determine total capacity $Q_{max}$ based on $SoC_{full}$, $SoC_{empty}$, and at least one of $Q_{chg}$ and $Q_{dsg}$; and
      provide a relaxation period subsequent to at least one of the charging cycle and the discharging cycle, and prior to at least one of measuring $SoC_{full}$ and $SoC_{empty}$.

10. The apparatus of claim 9, wherein the DoD threshold is determined based on battery age.

11. The apparatus of claim 10, wherein the DoD threshold is about 90%.

12. The apparatus of claim 10, wherein the control circuitry is further configured to terminate the discharging cycle responsive to transmission of a low battery signal.

13. The apparatus of claim 9, further comprising a battery readiness indicator, and wherein the control circuitry is further configured to terminate the relaxation period responsive to receiving a signal indicating readiness of the battery from the battery readiness indicator.

14. The apparatus of claim 9, further comprising a capacity indicator, and wherein the control circuitry is further configured to:
   determine a first estimate of total capacity $Q_{max}$ based on $Q_{chg}$;
   determine a second estimate of total capacity $Q_{max}$ based on $Q_{dsg}$;
   determine an average value of the first estimate and the second estimate; and update the capacity indicator based on the average value.

15. The apparatus of claim 14, further comprising a service indicator, and a storage device and wherein the control circuitry is further configured to store estimates of $Q_{max}$, and provide instructions to the service indicator to providing a service indication responsive to $Q_{max}$ deteriorating below a threshold.

16. A system comprising:
   a charging apparatus for charging one or more batteries; and
   a battery operatively coupled to the charging apparatus, the battery comprising:
      one or more electrochemical cells; and
      a battery management system comprising one or more processors operably coupled to the one or more electrochemical cells and configured to:
         determine an amount of charge $Q_{chg}$ delivered to the battery during a portion of a charging cycle;
         measure state of charge ($SoC_{full}$) of the battery subsequent to charging the battery,
         determine an amount of charge $Q_{dsg}$ produced by the battery during a discharging cycle of the battery to a depth of discharge (DoD) threshold;
         measure state of charge ($SoC_{empty}$) of the battery subsequent to discharging the battery;

determine total capacity $Q_{max}$ based on $SoC_{full}$, $SoC_{empty}$, and at least one of $Q_{chg}$ and $Q_{dsg}$; and provide a relaxation period subsequent to at least one of the charging cycle and the discharging cycle, and prior to at least one of measuring $SoC_{full}$ and $SoC_{empty}$.

17. The system of claim 16, wherein the DoD threshold is about 90%.

18. The system of claim 16, further comprising a capacity indicator, and wherein the battery management system is further configured to:
determine a first estimate of total capacity $Q_{max}$ based on $Q_{chg}$;
determine a second estimate of total capacity $Q_{max}$ based on $Q_{dsg}$;
determine an average value of the first estimate and the second estimate; and update the capacity indicator based on the average value.

19. The system of claim 18, further comprising a service indicator, and a storage device and wherein the battery management system is further configured to store estimates of $Q_{max}$, and provide instructions to the service indicator to providing a service indication responsive to $Q_{max}$ deteriorating below a threshold.

20. A method comprising:
determining an amount of charge $Q_{chg}$ delivered to a battery during a portion of a charging cycle;
measuring state of charge ($SoC_{full}$) of the battery subsequent to the charging cycle,
determining an amount of charge $Q_{dsg}$ produced by the battery during a discharging cycle of the battery to a depth of discharge (DoD) threshold;
measuring state of charge ($SoC_{empty}$) of the battery subsequent to discharging the battery;
determining total capacity $Q_{max}$ based on $SoC_{full}$, $SoC_{empty}$, and at least one of $Q_{chg}$ and $Q_{dsg}$;
determining a first estimate of total capacity $Q_{max}$ based on $Q_{chg}$;
determining a second estimate of total capacity $Q_{max}$ based on $Q_{dsg}$;
determining an average value of the first estimate and the second estimate;
updating a capacity indicator based on the average value; and
providing audio or visual display related to the updated capacity indicator.

21. The method of claim 20, wherein the DoD threshold is determined based on battery age.

22. The method of claim 20, wherein the DoD threshold is about 90%.

23. The method of claim 20, further comprising terminating the discharging cycle responsive to transmission of a low battery signal.

24. The method of claim 20, further comprising providing a relaxation period subsequent to at least one of the charging cycle and the discharging cycle, and prior to at least one of measuring $SoC_{full}$ and $SoC_{empty}$.

25. The method of claim 24, further comprising:
terminating the relaxation period responsive to receiving a signal indicating readiness of the battery.

26. The method of claim 20, further comprising:
providing an external power source, separate from the battery, during the discharging cycle.

27. The method of claim 20, further comprising:
storing estimates of $Q_{max}$; and
providing a service indication responsive to $Q_{max}$ deteriorating below a threshold.

28. An apparatus comprising:
a charger to charge one or more batteries;
a capacity indicator; and
control circuitry operably coupled to the charger and configured to:
determine an amount of charge $Q_{chg}$ delivered to a battery coupled to the charger during a portion of a charging cycle;
measure state of charge ($SoC_{full}$) of the battery subsequent to charging the battery,
determine an amount of charge $Q_{dsg}$ produced by the battery during a discharging cycle of the battery to a depth of discharge (DoD) threshold;
measure state of charge ($SoC_{empty}$) of the battery subsequent to discharging the battery;
determine total capacity $Q_{max}$ based on $SoC_{full}$, $SoC_{empty}$, and at least one of $Q_{chg}$ and $Q_{dsg}$;
determine a first estimate of total capacity $Q_{max}$ based on $Q_{chg}$;
determine a second estimate of total capacity $Q_{max}$ based on $Q_{dsg}$;
determine an average value of the first estimate and the second estimate; and
update the capacity indicator based on the average value.

29. The apparatus of claim 28, wherein the DoD threshold is determined based on battery age.

30. The apparatus of claim 28, wherein the DoD threshold is about 90%.

31. The apparatus of claim 28, wherein the control circuitry is further configured to terminate the discharging cycle responsive to transmission of a low battery signal.

32. The apparatus of claim 28, wherein the control circuitry is further configured to provide a relaxation period subsequent to at least one of the charging cycle and the discharging cycle, and prior to at least one of measuring $SoC_{full}$ and $SoC_{empty}$.

33. The apparatus of claim 32, further comprising a battery readiness indicator, and wherein the control circuitry is further configured to terminate the relaxation period responsive to receiving a signal indicating readiness of the battery from the battery readiness indicator.

34. The apparatus of claim 28, further comprising a service indicator, and a storage device and wherein the control circuitry is further configured to store estimates of $Q_{max}$, and provide instructions to the service indicator to providing a service indication responsive to $Q_{max}$ deteriorating below a threshold.

35. A system comprising:
a charging apparatus for charging one or more batteries;
a capacity indicator; and
a battery operatively coupled to the charging apparatus, the battery comprising:
one or more electrochemical cells; and
a battery management system comprising one or more processors operably coupled to the one or more electrochemical cells and configured to:
determine an amount of charge $Q_{chg}$ delivered to the battery during a portion of a charging cycle;
measure state of charge ($SoC_{full}$) of the battery subsequent to charging the battery,
determine an amount of charge $Q_{dsg}$ produced by the battery during a discharging cycle of the battery to a depth of discharge (DoD) threshold;
measure state of charge ($SoC_{empty}$) of the battery subsequent to discharging the battery;

determine total capacity $Q_{max}$ based on $SoC_{full}$, $SoC_{empty}$, and at least one of $Q_{chg}$ and $Q_{dsg}$;

determine a first estimate of total capacity $Q_{max}$ based on $Q_{chg}$;

determine a second estimate of total capacity $Q_{max}$ based on $Q_{dsg}$;

determine an average value of the first estimate and the second estimate; and update the capacity indicator based on the average value.

36. The system of claim 35, wherein the DoD threshold is about 90%.

37. The system of claim 35, wherein the battery management system is further configured to provide a relaxation period subsequent to at least one of the charging cycle and the discharging cycle, and prior to at least one of measuring $SoC_{full}$ and $SoC_{empty}$.

38. The system of claim 35, further comprising a service indicator, and a storage device and wherein the battery management system is further configured to store estimates of $Q_{max}$, and provide instructions to the service indicator to providing a service indication responsive to $Q_{max}$ deteriorating below a threshold.

* * * * *